US012752186B2

(12) United States Patent
Lu et al.

(10) Patent No.: US 12,752,186 B2
(45) Date of Patent: Oct. 6, 2026

(54) EXTERNAL CONTROLLER HAVING HEAT DISSIPATOR

(71) Applicant: DEXIN CORPORATION, New Taipei City (TW)

(72) Inventors: Ho-Lung Lu, New Taipei City (TW); Tzu-Hua Tseng, New Taipei City (TW)

(73) Assignee: DEXIN CORPORATION, New Taipei City (TW)

( * ) Notice: Subject to any disclaimer, the term of this patent is extended or adjusted under 35 U.S.C. 154(b) by 129 days.

(21) Appl. No.: 19/030,986

(22) Filed: Jan. 17, 2025

(65) Prior Publication Data

US 2025/0161800 A1 May 22, 2025

Related U.S. Application Data

(63) Continuation-in-part of application No. 17/994,096, filed on Nov. 25, 2022, now Pat. No. 12,251,625.

(60) Provisional application No. 63/644,592, filed on May 9, 2024, provisional application No. 63/401,972, filed on Aug. 29, 2022, provisional application No. 63/391,530, filed on Jul. 22, 2022.

(30) Foreign Application Priority Data

Feb. 16, 2022 (TW) .................................. 111105569
Sep. 20, 2024 (TW) .................................. 113135619

(51) Int. Cl.
*A63F 13/24* (2014.01)
*H05K 7/20* (2006.01)

(52) U.S. Cl.
CPC ......... *A63F 13/24* (2014.09); *H05K 7/20136* (2013.01); *H05K 7/20209* (2013.01)

(58) Field of Classification Search
CPC . A63F 13/24; H05K 7/20136; H05K 7/20209
See application file for complete search history.

(56) References Cited

U.S. PATENT DOCUMENTS 11,957,973 B1 * 4/2024 Townley ............. A63F 13/2145
2013/0095925 A1 * 4/2013 Xu .......................... G06F 1/206
463/37
2022/0032179 A1 * 2/2022 Khaira .................... A63F 13/23

* cited by examiner

*Primary Examiner* — Werner G Garner
(74) *Attorney, Agent, or Firm* — Li & Cai Intellectual Property (USA) Office

(57) ABSTRACT

An external controller having a heat dissipator includes a first control member, a second control member, and a connection member interconnected to the first control member and the second control member. The connection member includes a mounting structure for mounting a handheld device. The connection member includes a communication interface that is used to signally connect with the handheld device. The external controller has the heat dissipator that is disposed in the connection member. The heat dissipator includes a control circuit and a cooling interface. The control circuit is electrically connected with a power management circuit disposed in the first control member or the second control member for obtaining driving power. The handheld device that is in operation can be cooled through the cooling interface.

15 Claims, 7 Drawing Sheets

EXTERNAL CONTROLLER HAVING HEAT DISSIPATOR

CROSS-REFERENCE TO RELATED PATENT APPLICATION

This application is a continuation-in-part application claiming priority under 35 U.S.C. 120 to the U.S. patent application Ser. No. 17/994,096, filed on Nov. 25, 2022, and entitled "CONTROL ASSEMBLY FOR PORTABLE ELECTRONIC DEVICE", which claims the priority benefits under 35 U.S.C. 119(e) to U.S. provisional application Ser. No. 63/391,530, filed on Jul. 22, 2022, U.S. provisional application Ser. No. 63/401,972, filed on Aug. 29, 2022, and priority under 35 U.S.C. § 119(a) to patent application No. 111105569 filed in Taiwan (R.O.C.) on Feb. 16, 2022.

This application claims the benefit of priority under 35 U.S.C. § 119(e) to the U.S. Provisional Patent Application Ser. No. 63/644,592, filed on May 9, 2024.

This application claims the benefit of priority under 35 U.S.C. § 119(a) to patent application No. 113135619, filed in Taiwan (R.O.C.) on Sep. 20, 2024, which claims the benefit of priority under 35 U.S.C. § 119(e) to the U.S. Provisional Patent Application Ser. No. 63/644,592, filed on May 9, 2024.

The entirety of each of the above-mentioned patent applications is hereby incorporated by reference herein.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an external controller adapted to a handheld device, and more particularly to an external controller having a heat dissipator that can cool down a handheld device in operation.

BACKGROUND OF THE DISCLOSURE

In addition to transmitting messages, displaying audiovisual contents, and processing daily tasks, a mobile device (such as a mobile phone or a tablet computer) further provides users with various interactive entertainment functions, e.g., video games.

Manufacturers have designed an external controller that is exclusive for gaming on the mobile device. Such external controller is also referred to as a game pad, which allows the mobile device to be mounted thereon. Connection between the external controller and the mobile device is established in a wired or wireless manner, and is used to transmit gaming signals. The users can manipulate physical keypads or joysticks of the external controller to play games.

However, when the mobile device is in operation for a long time (especially when running games that require a significant amount of real-time calculations), the mobile device will generate heat. The high temperature may negatively affect operation performance of the mobile device. Therefore, apart from a heat-dissipation mechanism of the mobile device itself, it is necessary to develop additional technical solutions for heat dissipation when playing games with the mobile device that is mounted on the external controller.

SUMMARY OF THE DISCLOSURE

In response to the above-referenced technical inadequacy of a conventional external controller that requires an additional heat-dissipation solution, the present disclosure provides an external controller having a heat dissipator.

In an aspect of the present disclosure, the external controller having the heat dissipator includes a first control member, a second control member, and a connection member. Two ends of the connection member are respectively connected with the first control member and the second control member via a connection mechanism and an electrical connection line. The connection member includes a mounting structure that is used to mount a handheld device on the external controller. The connection member includes a communication interface that is used to signally connect with the handheld device. The external controller is equipped with the heat dissipator that can be disposed in the connection member, so as to cool down the handheld device that is in operation.

Main components of the heat dissipator include a control circuit and a cooling interface that is used to cool down the handheld device that is in operation. The control circuit is electrically connected with a power management circuit that is disposed in the first control member or the second control member, so that the heat dissipator can obtain driving power from the handheld device.

Preferably, the heat dissipator is a miniature fan driven by a micro motor or a cooler driven by a voltage for achieving a cooling effect.

Further, a temperature sensor is disposed in the connection member, so that the control circuit regulates a rotating speed of the miniature fan based on a temperature to be sensed.

Still further, the control circuit of the heat dissipator includes an energy-stored element, and the energy-stored element acts as a buffering element for the heat dissipator that is simultaneously activated when the external controller is activated.

Further, the external controller includes an extension interface that is used to connect with a second heat dissipator or a peripheral device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
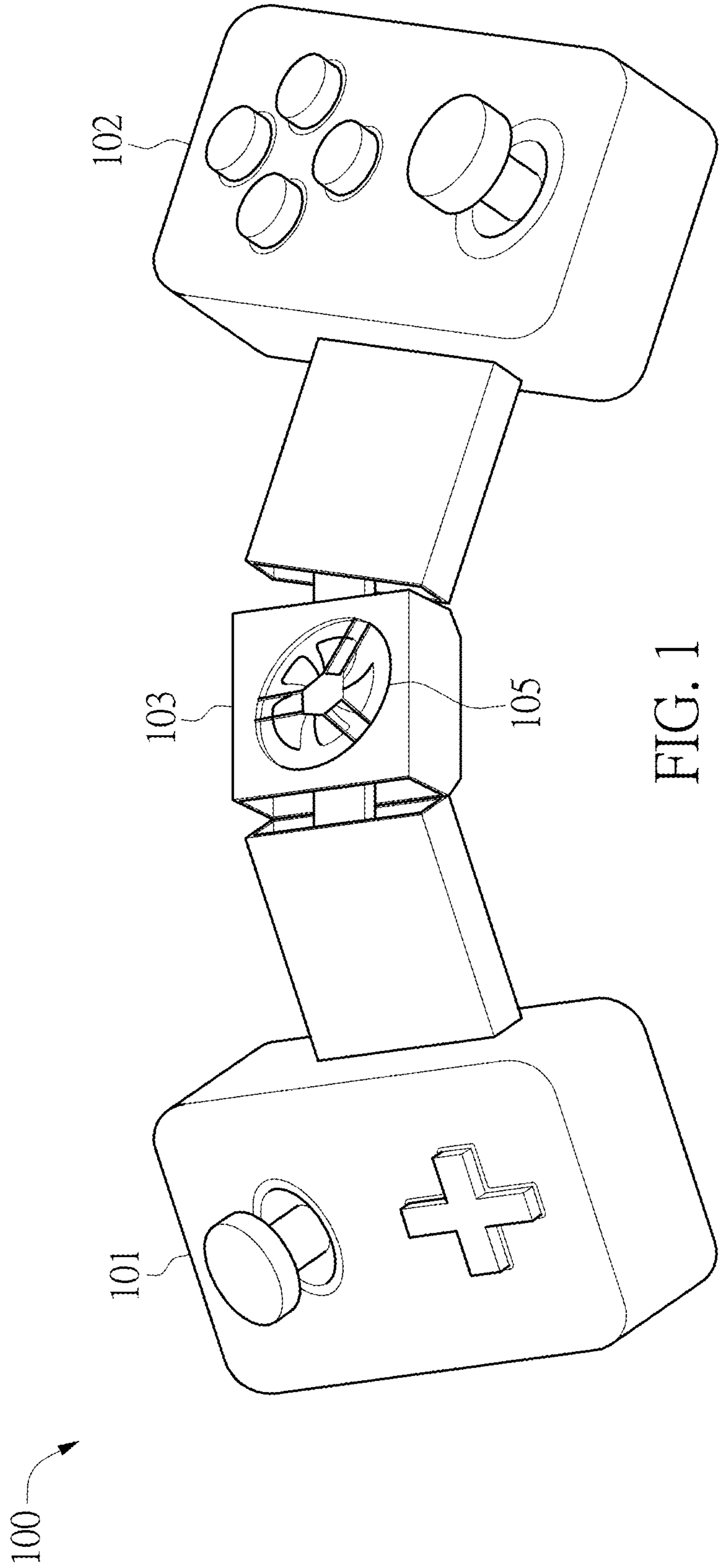
FIG. 1 is a schematic diagram illustrating an external controller having a heat dissipator according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

The present disclosure relates to an external controller having a heat dissipator. The external controller is especially designed for controlling software operated in a handheld device (e.g., a mobile phone or a tablet computer). The external controller connects with the handheld device via a specific mechanical design and a connection means. The external controller allows a user to control the handheld device with a physical controller and manipulate software therein. For example, the handheld device executes a video game, and the user can use the external controller to manipulate the video game.

Reference is made to FIG. 1, which is a schematic diagram illustrating an appearance design of the external controller having the heat dissipator according to a first embodiment of the present disclosure. Main components of an external controller 100 shown in the diagram include a first control member 101 provided for left-hand operation and a second control member 102 provided for right-hand operation. The first control member 101 and the second control member 102 are interconnected through a connection mechanism (such as a bridging mechanism) that is designed in a connection member 103. The first control member 101 and the second control member 102 are also connected via circuits and with connection interfaces.

In one of the embodiments, the connection member 103 can be designed to have one or more bendable hinge structures for easy storage. Further, the connection member 103 can be designed to have a telescopic mechanism for mounting handheld devices in various sizes (not shown in the diagram), and can also be designed to have a mechanism for fixing the handheld device. The fixing mechanism is, for example, clamping structures disposed on left and right portions that are respectively connected with the first control member 101 and the second control member 102 for clamping the handheld device.

There is the problem of heating when software is operated in the handheld device for a long time, especially when the mobile device runs the video game that requires a significant amount of real-time calculations. Thus, the external controller 100 with a heat dissipator 105 that is disposed in the connection member 103 is provided. Structure-wise, the connection member 103 shown in the diagram is composed of a foldable structure with multiple sections. The heat dissipator 105 can be disposed in one of the multiple sections of the foldable structure. The heat dissipator 105 includes a control circuit that is used to drive operation of the heat dissipator 105 and a cooling interface that contacts or keeps a distance from the handheld device for cooling down the handheld device that is in operation. In FIG. 1, the heat dissipator 105 is, for example, a miniature fan driven by a micro motor. Furthermore, the heat dissipator 105 can be implemented by various types of motor-driven fans. The fans can be driven to rotate and achieve heat dissipation by, for example, a rotor motor that includes a stator bearing (which is formed by permanent magnets), a spindle, and a rotor made of coils. Alternatively, a cooler that is driven by a voltage to achieve cooling effect can also be adopted in the heat dissipator 105. The cooler can be a cooling chip that uses semiconductor materials to achieve active heat dissipation, so that the heated handheld device can be cooled down.

Figure 2:
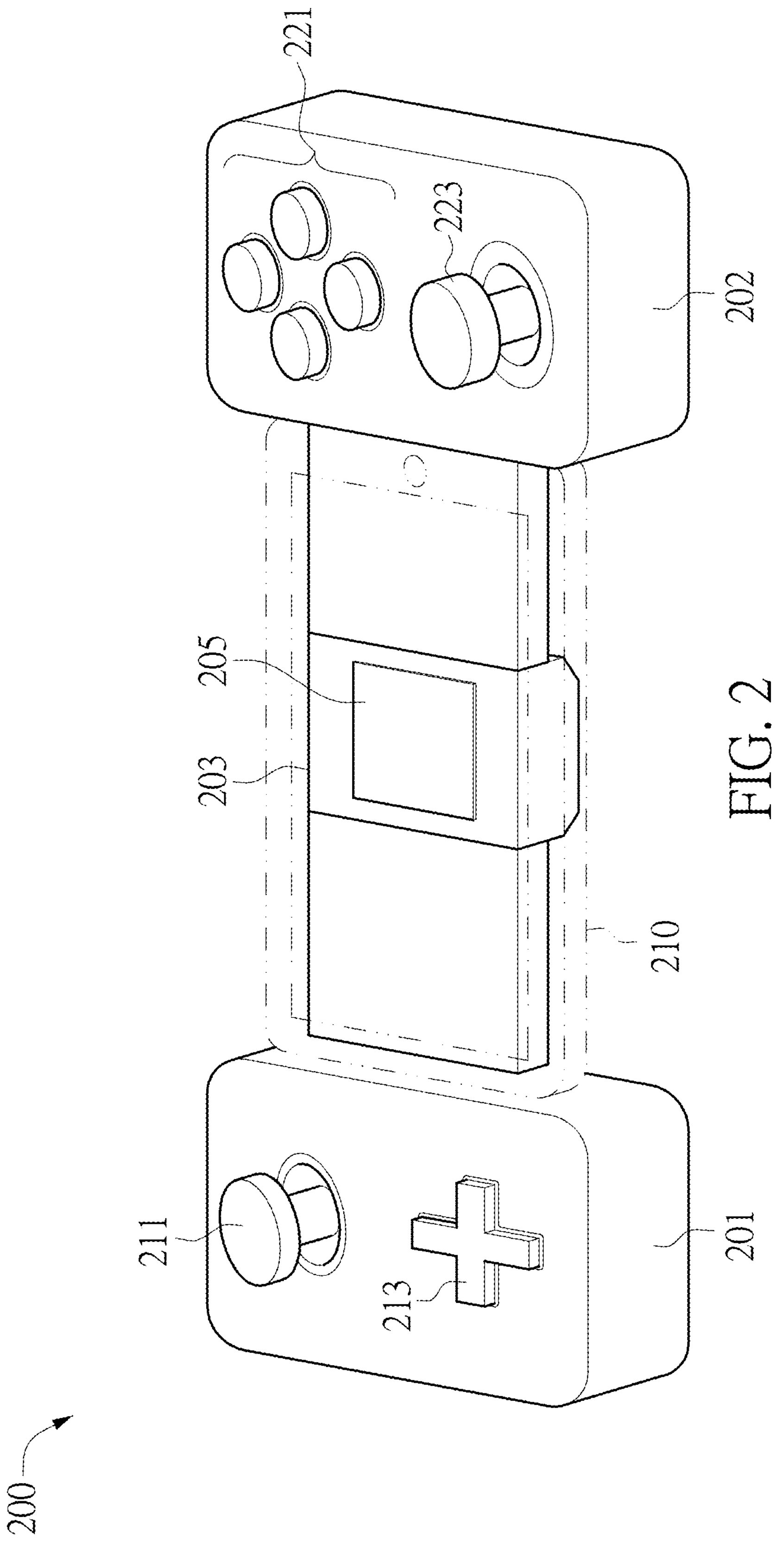
FIG. 2 is a schematic diagram illustrating the external controller having the heat dissipator according to a second embodiment of the present disclosure.

Reference is made to FIG. 2, which is a schematic diagram illustrating the external controller having the heat dissipator according to a second embodiment of the present disclosure. Main members of an external controller 200 shown in the diagram include a first control member 201 and a second control member 202 that are respectively provided for the user to manipulate the external controller having his left and right hands. The first control member 201 and the second control member 202 respectively include a manipulation interface having a keypad set and a joystick that are provided for the user to manipulate the external controller 200 to generate control signals to a handheld device 210.

According to certain embodiments of the present disclosure, the first control member 201 and the second control member 202 of the external controller 200 act as two handle bars that are provided for the user to manipulate the handheld device 210 with his left and right hands, respectively. The first control member 201, the second control member 202, and a connection member 203 can be removably assembled at both sides of the handheld device 210. The external controller 200 provides a structural design that allows the user to hold and operate the handheld device 210. Further, the connection member 203 includes various types of mounting structures for mounting the handheld device 210 on the external controller 200.

In an exemplary example shown in the diagram, the external controller 200 provides a manipulation interface that includes keypads, knobs, and joysticks. The manipulation interface is provided for the user to manipulate the external controller 200. The control signals that are generated when the user manipulates the external controller 200 are transmitted to the handheld device 210 via a communication interface. In the diagram, a first joystick 211 and a first keypad set 213 are disposed on the first control member 201, and the related circuits of the manipulation interface are disposed in the first control member 201. A second keypad set 221 and a second joystick 223 are disposed on the second control member 202, and the related circuits of the manipulation interface are also disposed in the second control member 202. In particular, the connection member 203 between the first control member 201 and the second control member 202 mounts the handheld device 210 by a clamping structure. The external controller 200 can be connected with the handheld device 210 via a wired connection (e.g., USB Type-C) and a specific communication interface, or by a wireless communication connection (e.g., Bluetooth communication).

In one of the embodiments of the present disclosure, the handheld device 210 supplies electric power to the external controller 200 via the communication interface. For example, the external controller 200 is disposed with a universal serial bus (USB) or a communication interface having a specific format that is used to electrically connect with a power management chip of the handheld device 210. The handheld device 210 can supply power to the external controller 200 via a connection line (such as a USB cable), so that the external controller 200 can operate with the power supplied by the handheld device 210.

According to one of the embodiments of the external controller 200, a heat dissipator 205 is disposed on the position where the connection member 203 of the external controller 200 contacts the handheld device 210. The present example shows that the heat dissipator 205 is implemented by a cooling chip driven by voltages. The cooling chip is electrically connected with a heat-conducting interface on the connection member 203 for dissipating heat of the handheld device 210.

Figure 3:
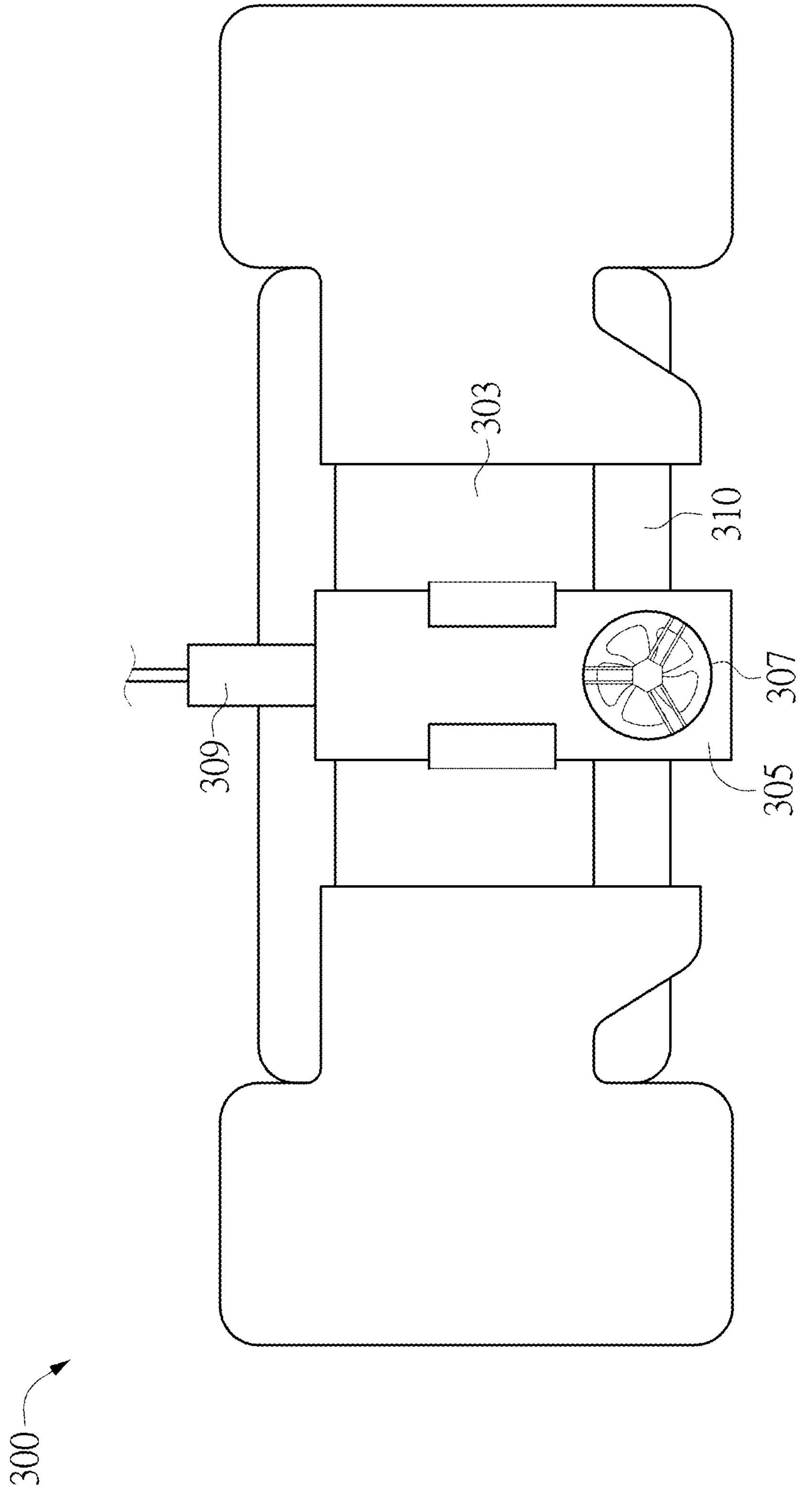
FIG. 3 is a schematic diagram illustrating the external controller having the heat dissipator according to a third embodiment of the present disclosure.

FIG. 3 next shows a schematic diagram illustrating the external controller having the heat dissipator according to a third embodiment of the present disclosure. The diagram exemplarily shows a back structure of an external controller 300. Two control members of the external controller 300 are provided respectively for the left and right hands of the user to hold and manipulate the external controller 300. A connection member 303 that bridges the two control members can be used to mount a handheld device 310. In an exemplary example, a mounting structure is used to mount the handheld device 310, and the mounting structure is an extendable or elastic structure that can be used to mount the handheld device 310 in various sizes.

A heat-dissipation module 305 is embedded in the connection member 303. The cooling interface that contacts the handheld device 310 can be a fan-type heat dissipator 307. The connection member 303 includes a communication interface to connect with a connection line 309 that is used to connect with an external device, so as to signally connect with the handheld device 310 that is mounted on the external controller 300. The communication interface is used to transmit control signals that are generated when the user manipulates the external controller 300 or feedback signals transmitted by the handheld device 310. The communication interface is also electrically connected with power management circuits of the handheld device 310 and the external controller 300. The external controller 300 can accordingly receive a driving power from the handheld device 310.

The communication interface of the external controller 300 can be a Type-C USB connector that is used to connect with an external device. The communication interface can be disposed at a middle position of the connection member 303 for preventing interference from a charging cable when the handheld device 310 is operated and charged at the same time.

Figure 4:
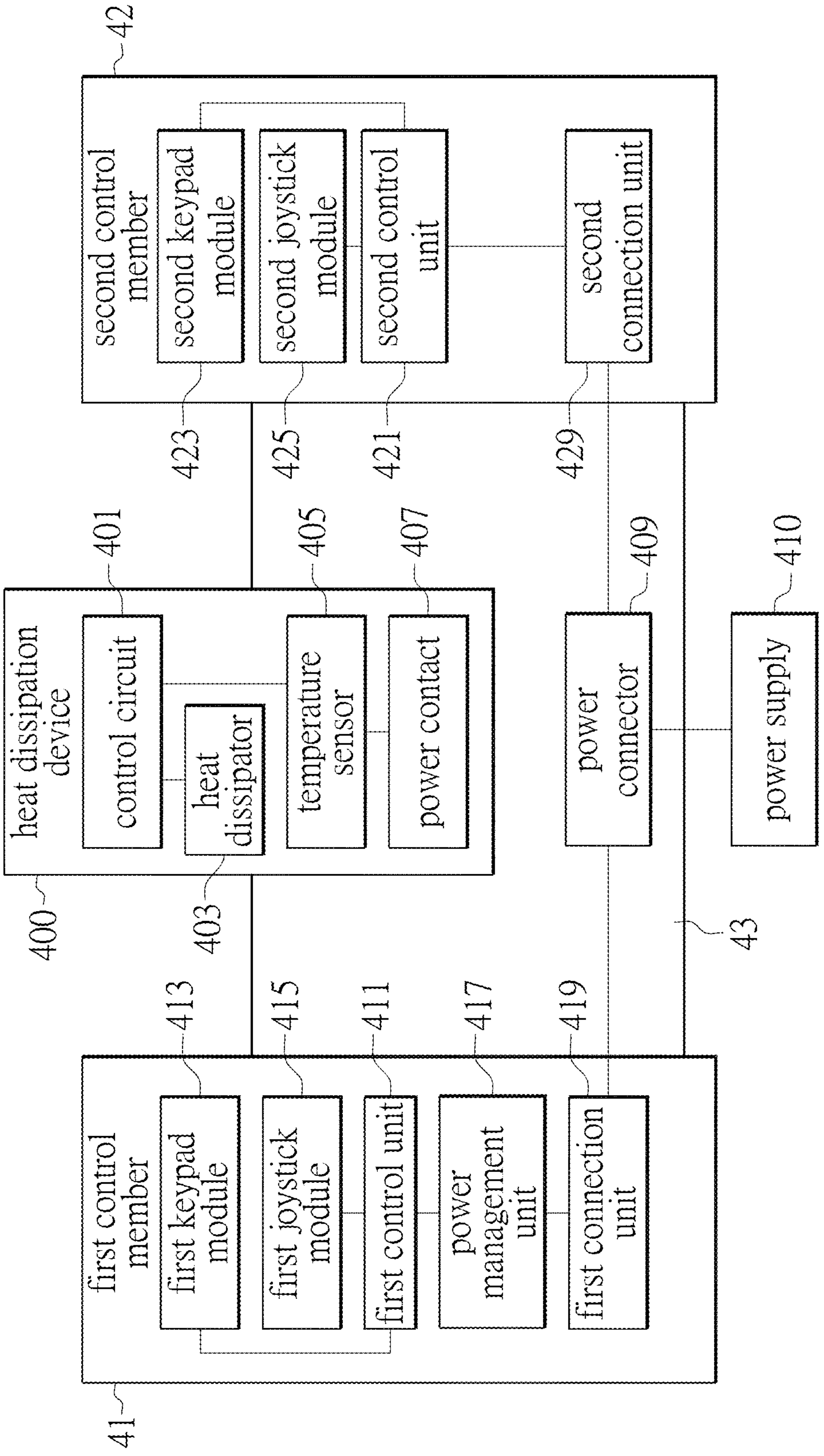
FIG. 4 is a schematic diagram illustrating a circuit module of the external controller having the heat dissipator according to one embodiment of the present disclosure.

FIG. 4 is a schematic diagram illustrating a circuit module of the external controller having the heat dissipator according to one embodiment of the present disclosure.

Reference can be made to the schematic diagram of FIG. 4. Main circuit components of a first control member 41 of the external controller include a first control unit 411 for controlling operations of the first control member 41 and other circuits (such as a first keypad module 413 having a manipulation interface and a first joystick module 415) that are electrically connected with the first control unit 411.

In the present diagram, the first control member 41 includes a power management unit 417 that is adapted to the external controller. The power management unit 417 can also be disposed in a second control member 42. A first connection unit 419 of the first control member 41 can be electrically connected with a power connector 409 of a connection member 43 of the external controller. The power connector 409 is, for example, a Type-C USB communication interface. The power connector 409 connects with a power supply 410, and the power supply 410 can be disposed inside the handheld device mounted on the external controller or other devices. One of the major objectives of the power connector 409 is to receive electric power over a connection line and transmit signals. On the other hand, a second connection unit 429 of the second control member 42 is also electrically connected with the power connector 409 for receiving the electric power and transmitting the signals.

The second control member 42 includes a second control unit 421 that control operations of the second control member 42, a second keypad module 423 and a second joystick module 425 that are operable by being electrically connected with the second control unit 421, and a second connection unit 429 that is connected with the power connector 409.

The connection member 43 of the external controller includes a heat-dissipation device 400. In certain embodiments of the present disclosure, the heat-dissipation device 400 can be a standalone device disposed on the connection member 43, or a dissipation module embedded into the connection member 43. One of the major objectives of the heat-dissipation device 400 is to cool down the handheld device mounted on the external controller.

The heat-dissipation device 400 includes a control circuit 401 that is used to control operations of the heat-dissipation device 400. The other circuit components of the heat-dissipation device 400 are electrically connected with the control circuit 401. The control circuit 401 is electrically connected with a heat dissipator 403. As mentioned in the above embodiments, the heat dissipator 403 can be a micro-motor-driven fan or a voltage-driven cooling chip. The heat-dissipation device 400 connects with the circuits (e.g., the power connector 409) of the external controller via power contacts 407, so that the heat-dissipation device 400 can receive electric signals via the power contacts 407.

In one embodiment of the present disclosure, the heat dissipator 403 is in operation according to control signals generated by the control circuit 401. The control circuit 401 can control heat dissipation performance of the heat dissipator 403. For example, the control circuit 401 is able to regulate the heat dissipation performance according to a temperature sensed by a temperature sensor 405 of the heat-dissipation device 400. The temperature sensor 405 is used to sense an operational temperature of the handheld device that is mounted on the external controller. The control circuit 401 monitors the temperature of the handheld device by the temperature sensor 405. A rotating speed of the fan or the cooling effect of the cooler can be forcedly controlled when the temperature reaches a threshold. For example, the fan can be designed to have multistage rotating speeds, and the multistage rotating speeds of the fan can be regulated based on different temperatures. Alternatively, different levels of the cooling effect of the cooler can be controlled by different voltages.

In one further embodiment of the present disclosure, in addition to controlling the heat dissipation performance based on temperatures sensed by the temperature sensor 405, the control circuit 401 of the heat-dissipation device 400 also allows the user to actively regulate the heat dissipation performance by manipulating the external controller. For example, the user can use the keypad, the joystick, or a hotkey that is configured by combo keys or the joystick to control the rotating speed of the fan or the voltage of the cooler (for adjustment of the cooling effect).

Figure 5:
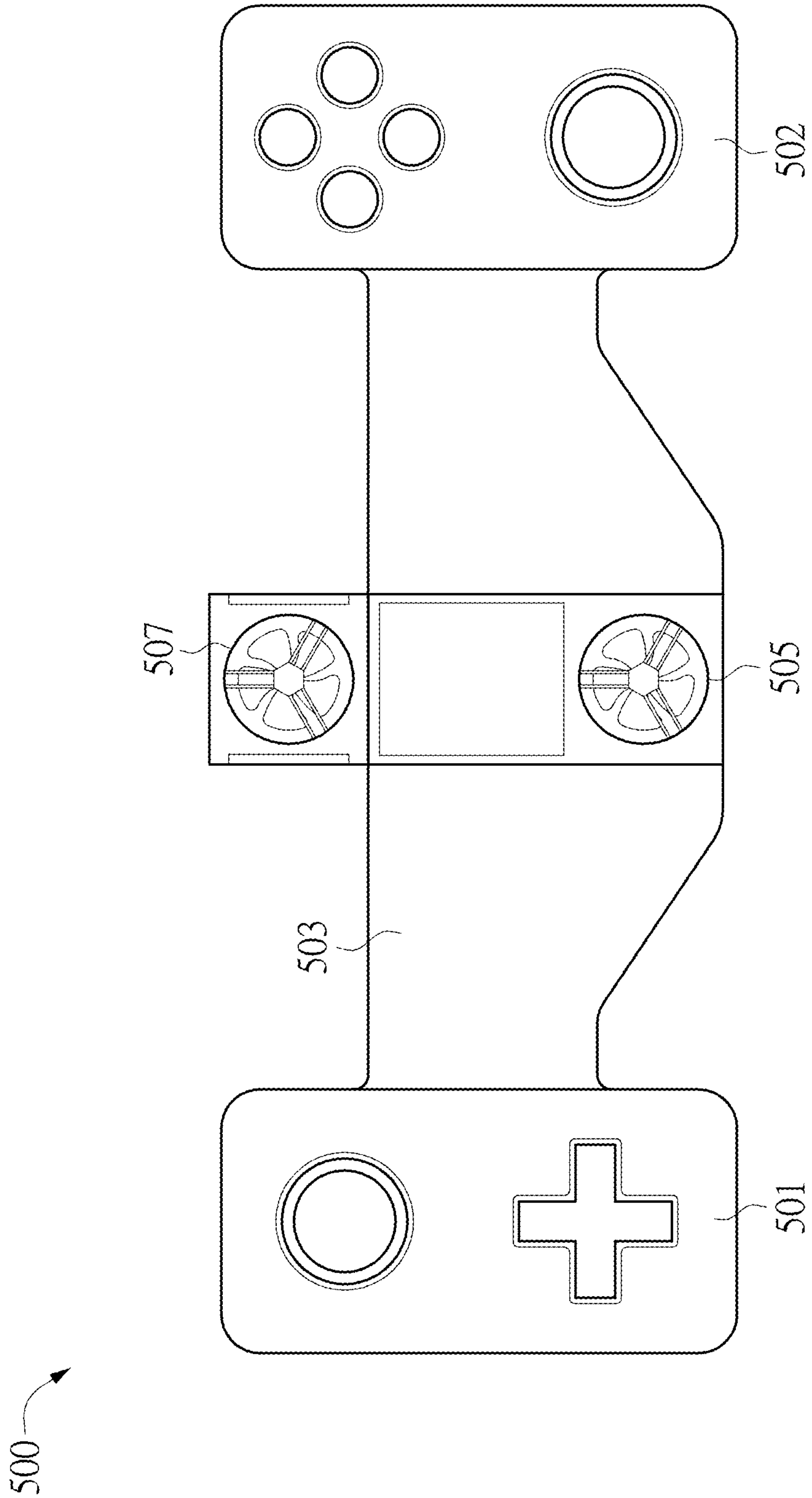
FIG. 5 is a schematic diagram illustrating the external controller having the heat dissipator according to a fourth embodiment of the present disclosure.

Reference is made to FIG. 5, which is a schematic diagram illustrating the external controller that can be expanded with peripheral devices according to one embodiment of the present disclosure. Apart from the embedded heat dissipator, the external controller is expandable via the communication interface that acts as an extension interface for externally connecting with another peripheral device. The peripheral device can be another heat dissipator or cooler.

An external controller 500 shown in FIG. 5 includes a first control member 501 and a second control member 502 that allow the user to manipulate the external controller by his left and right hands. A connection member 503 that bridges the first control member 501 and the second control member 502 includes a first heat dissipator 505 and an extension interface that can be implemented by a communication interface. The extension interface can be used to connect with a second heat dissipator 507 or another peripheral device. Taking a video game operated in the handheld device as an example, the extension interface allows the external controller to connect with various peripheral devices, such as an external vibrator, a lamp unit (e.g., an atmosphere lamp), and a speaker that can increase gaming fun. Furthermore, in order to provide an immersive gaming experience, the external controller 500 can connect with a virtual reality (VR) device (such as VR glasses) via the extension interface for collaboratively operating with the game running in the handheld device.

In one further embodiment of the present disclosure, the extension interface of the connection member 503 can be implemented by some specific electrical pins, such as pogo pins or magnetic attachment pins. These electrical pins allow the external peripheral device to stably and electrically connect with the external controller for the sake of receiving electric power.

Figure 6:
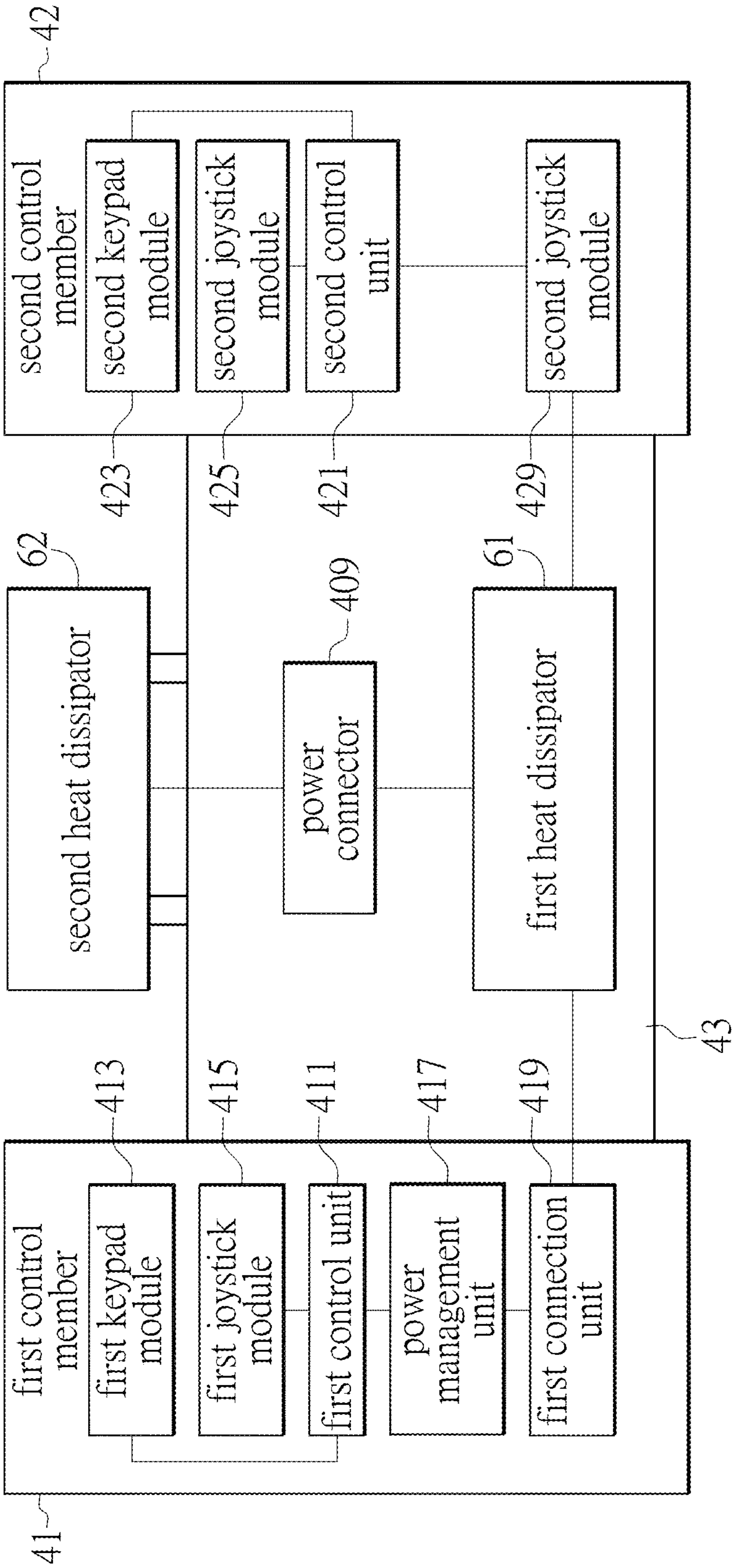
FIG. 6 is a schematic diagram illustrating the circuit module of the external controller having the heat dissipator according to another embodiment of the present disclosure.

Reference is made to FIG. 6, which is a schematic diagram illustrating a circuit module for expanding the peripheral devices of the external controller according to one further embodiment of the present disclosure.

For relevant details, reference can also be made to the circuits exemplarily shown in FIG. 4. Main components of an external controller of FIG. 6 include the first control member 41, the second control member 42, and the connection member 43. Main circuit components in the connection member 43 include the power connector 409 that is used to interface with an external power supply. The power connector 409 also allows a first heat dissipator 61 and a second heat dissipator 62 that is externally connected via the extension interface to electrically connect with the power supply 410 for acquiring electric power. The first heat dissipator 61 and the second heat dissipator 62 can also receive control signals generated by the external controller via the power connector 409.

Based on the connectivity of the circuits of the external controller, both the first connection unit 419 of the first control member 41 and the second connection unit 429 of the second control member 42 in the external controller are electrically connected with the built-in first heat dissipator 61. The first heat dissipator 61 is operated according to the control signals that are generated when the user manipulates the first control member 41 and the second control member 42, and receives electric power via the power connector 409. The first heat dissipator 61 can also electrically connect with the second heat dissipator 62 based on the above connectivity of the circuits. Therefore, the first heat dissipator 61 and the second heat dissipator 62 can both be controlled by the external controller.

Figure 7:
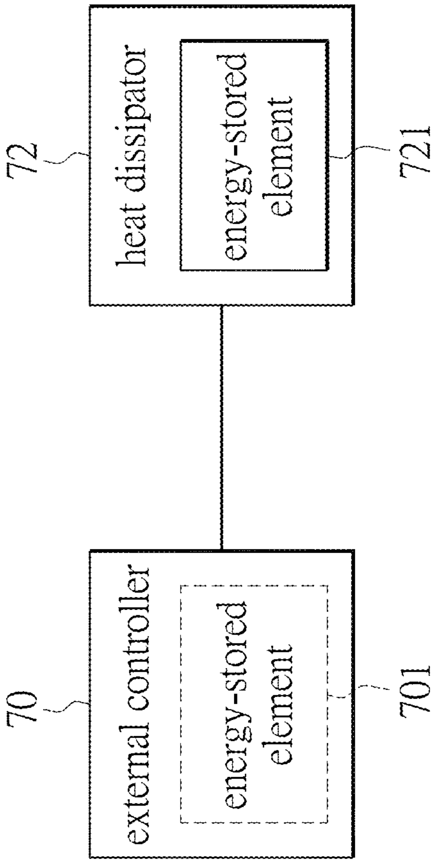
FIG. 7 is a schematic diagram illustrating the external controller being equipped with an energy-stored element according to one embodiment of the present disclosure.

For certain embodiments of the external controller having the heat dissipator, reference is made to FIG. 7. Here, the control circuit of the heat dissipator includes an energy-stored element, such as an energy-stored element 721 disposed in the heat dissipator 72 or a controller-end energy-stored element 701 of the external controller 70. The energy-stored element (721 or 701) can be installed on the circuitry for the heat dissipator 72 to receive electric power, and acts as a buffering element for the heat dissipator 72 being activated when the external controller 70 is activated simultaneously.

In an exemplary example, the energy-stored element (721 or 701) can be a capacitor or a small capacity battery. When the external controller 70 and the heat dissipator 72 are activated together, the energy-stored element is used as the buffering element when a large current is received. The buffering element is used as one of measures for protecting the circuits. The buffering element can be charged in advance when the external controller is in operation, and thus can provide initial power for operating the heat dissipator 72 without being directly impacted by a large current. In this way, electronic components can be prevented from being damaged by the large current that is generated during activation of the heat dissipator 72.

In conclusion, according to the above embodiments of the external controller having heat dissipator, the external controller can internally or externally be equipped with one or more heat dissipators that provide a heat-dissipation solution for the handheld device that is mounted on the external controller.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An external controller, comprising:

a first control member;

a second control member;

a connection member, wherein the connection member have two ends that are respectively connected with the first control member and the second control member via a connection mechanism and an electrical connection line, and the connection member includes a mounting structure for mounting a handheld device; and a heat dissipator disposed in the connection member, wherein the heat dissipator includes a control circuit and a cooling interface for cooling the handheld device that is in operation, and the control circuit electrically connects with a power management circuit that is disposed inside the first control member or the second control member, so as to enable the first control member or the second control member to obtain driving power.

2. The external controller according to claim 1, wherein the first control member and the second control member each include a manipulation interface having a keypad set and a joystick that are provided for a user to manipulate the external controller, so as to generate control signals to be transmitted to the handheld device.

3. The external controller according to claim 2, wherein the external controller includes a communication interface that is disposed on the connection member, and the communication interface is used to connect with the handheld device and obtain electric power from the handheld device.

4. The external controller according to claim 2, further comprising an extension interface that is used to connect with a second heat dissipator or a peripheral device.

5. The external controller according to claim 4, wherein the extension interface is a pogo pin.

6. The external controller according to claim 1, wherein the heat dissipator is a miniature fan driven by a micro motor.

7. The external controller according to claim 6, wherein a temperature sensor is further disposed in the connection member, so that the control circuit regulates a rotating speed of the miniature fan based on a temperature sensed by the temperature sensor.

8. The external controller according to claim 7, wherein the first control member and the second control member each include a manipulation interface having a keypad set and a joystick that are provided for a user to manipulate the external controller, so as to generate control signals to be transmitted to the handheld device.

9. The external controller according to claim 6, wherein the connection member is formed by a foldable structure with multiple sections, and the heat dissipator is disposed in one of the multiple sections of the foldable structure.

10. The external controller according to claim 1, wherein the heat dissipator is a cooler driven by a voltage to provide a cooling effect.

11. The external controller according to claim 1, wherein the control circuit of the heat dissipator includes an energy-stored element, and the energy-stored element acts as a buffering element for the heat dissipator that is simultaneously activated when the external controller is activated.

12. The external controller according to claim 11, wherein the first control member and the second control member respectively include a manipulation interface having a keypad set and a joystick that are provided for a user to manipulate the external controller to generate control signals to the handheld device.

13. The external controller according to claim 12, wherein the external controller includes a communication interface that is disposed on the connection member, and the communication interface is used to connect with the handheld device and obtain electric power from the handheld device.

14. The external controller according to claim 12, further comprising an extension interface that is used to connect with a second heat dissipator or a peripheral device.

15. The external controller according to claim 14, wherein the extension interface is a pogo pin.

* * * * *